United States Patent
Um

(10) Patent No.: US 10,185,516 B2
(45) Date of Patent: Jan. 22, 2019

(54) MEMORY SYSTEM FOR RE-ORDERING PLURAL COMMANDS AND OPERATING METHOD THEREOF

(71) Applicant: SK hynix Inc., Gyeonggi-do (KR)

(72) Inventor: Gi-Pyo Um, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 57 days.

(21) Appl. No.: 15/398,861

(22) Filed: Jan. 5, 2017

(65) Prior Publication Data
US 2017/0300269 A1   Oct. 19, 2017

(30) Foreign Application Priority Data

Apr. 14, 2016   (KR) .................. 10-2016-0045603

(51) Int. Cl.
| | | |
|---|---|---|
| G06F 12/00 | (2006.01) | |
| G06F 3/06 | (2006.01) | |
| G06F 11/10 | (2006.01) | |
| G11C 29/52 | (2006.01) | |

(52) U.S. Cl.
CPC .......... G06F 3/0659 (2013.01); G06F 3/0611 (2013.01); G06F 3/0679 (2013.01); *G06F 3/064* (2013.01); *G06F 3/0619* (2013.01); *G06F 11/1068* (2013.01); *G11C 29/52* (2013.01)

(58) Field of Classification Search
CPC .... G06F 3/0659; G06F 3/0679; G06F 3/0611; G06F 11/1068; G06F 3/064; G06F 3/0619; G11C 29/52
USPC .......................... 711/158, 154, 103; 710/244
See application file for complete search history.

(56) References Cited

U.S. PATENT DOCUMENTS

| | | | | |
|---|---|---|---|---|
| 7,996,642 | B1* | 8/2011 | Smith | G06F 12/0246 |
| | | | | 711/154 |
| 9,158,676 | B2* | 10/2015 | Yi | G06F 12/0246 |
| 9,432,298 | B1* | 8/2016 | Smith | H04L 49/9057 |
| 2005/0021921 | A1* | 1/2005 | Blackmon | G06F 13/1631 |
| | | | | 711/168 |
| 2016/0371014 | A1* | 12/2016 | Roberts | G06F 3/0611 |
| 2017/0060422 | A1* | 3/2017 | Sharifie | G06F 3/061 |
| 2017/0293430 | A1* | 10/2017 | Shin | G06F 3/0604 |

* cited by examiner

*Primary Examiner* — Hong C Kim
(74) *Attorney, Agent, or Firm* — IP & T Group LLP

(57) ABSTRACT

A memory system includes a memory device comprising a plurality of memory cells in which data is stored; and a controller suitable for checking types and/or priorities of a plurality of commands received from a host based on index or identification of the commands, re-order the commands depending on the types and/or the priorities, and perform command operations corresponding to the re-ordered commands.

20 Claims, 11 Drawing Sheets

MEMORY SYSTEM FOR RE-ORDERING PLURAL COMMANDS AND OPERATING METHOD THEREOF

CROSS-REFERENCE TO RELATED APPLICATION

This application claims priority under 35 U.S.C. § 119(a) to Korean Patent Application No. 10-2016-0045603 filed on Apr. 14, 2016 in the Korean Intellectual Property Office, the disclosure of which is incorporated herein by reference in its entirety.

TECHNICAL FIELD

Exemplary embodiments relate to a memory system and, more particularly, to a memory system that processes data to a memory device and an operating method thereof.

DISCUSSION OF THE RELATED ART

The computer environment paradigm has shifted to ubiquitous computing systems that can be used anytime and anywhere. Due to this fact, use of portable electronic devices such as mobile phones, digital cameras, and notebook computers has rapidly increased. These portable electronic devices generally use as a data storage device a memory system having one or more memory devices for storing data. The memory system may be used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

Consumer demand for faster, more capable and more reliable electronic devices requires improved memory systems.

SUMMARY

Various embodiments of the present invention are directed to a memory system exhibiting reduced complexity, enhanced performance, and enhanced efficiency in using a memory device, to thereby more rapidly and reliably process data to and from the memory device, and an operating method thereof.

In an embodiment, a memory system may include a memory device comprising a plurality of memory cells in which data is stored; and a controller suitable for checking types and/or priorities of a plurality of commands received from a host based on index or identification of the commands, re-order the commands depending on the types and/or the priorities, and perform command operations corresponding to the re-ordered commands.

The priorities may indicate priorities of the command operations or priorities of data corresponding to the command operations, and may be included in the commands in the form of a context or a flag.

The priorities may indicate priorities between a first command operation or first data corresponding to a first command received from the host at a first time, and a second command operation or second data corresponding to the second command received from the host at a second time.

The priorities may be determined depending on at least one of a value of data corresponding to the command operations, reliabilities of the command operations for the data, a processing reliability of the data, and a size of the data.

The types may be determined depending on at least one of characteristics of data corresponding to the command operations, a locality of the data, a processing pattern of the data, and a frequency, the number of times or aging of the command operations for the data.

The memory device may include a plurality of memory dies, each memory die including a plurality of memory planes, each plane including a plurality of memory blocks, said plurality of memory cells being distributed among the plurality of memory blocks, and the command operations may include a read operation or write operation for random/sequential/hot/cold data, and a background operation for the memory device.

The controller may successively perform the command operations from a command operation having a highest priority according to the priorities, and may simultaneously perform command operations for data of the same type according to the types.

The background operation may include a GC (Garbage Collection) operation, a WL (Wear Leveling) operation, and a map flush operation.

The controller may simultaneously perform first command operations corresponding to first commands.

The first command operations may be command operations for sequential data according to the types of the commands.

In an embodiment, an operating method of a memory system to may include: receiving a plurality of commands from a host for a plurality of pages, which are included in each of a plurality of memory blocks of a memory device, and which include a plurality of memory cells; checking types and/or priorities of the commands based on index or identification of the commands; re-ordering the commands depending on the types and the priorities; and performing command operations corresponding to the re-ordered commands on the memory dies.

The priorities may indicate priorities of the command operations or priorities of data corresponding to the command operations, and may be included in the commands in the form of context or flag.

The priorities may indicate priorities between a first command operation or first data corresponding to a first command received from the host at a first time, and a second command operation or second data corresponding to the second command received from the host at a second time.

The priorities may be determined depending on at least one of a value of data corresponding to the command operations, reliabilities of the command operations for the data, a processing reliability of the data, and a size of the data.

The types may be determined depending on at least one of characteristics of data corresponding to the command operations, a locality of the data, a processing pattern of the data, and a frequency, the number of times or aging of the command operations for the data.

The command operations may include a read operation or write operation for random/sequential/hot/cold data, and a background operation for the memory device.

The performing of command operations corresponding to the re-ordered commands on the memory dies may include: successively performing the command operations from a command operation having a highest priority according to the priorities, and simultaneously performing command operations for data of the same type according to the types.

The background operation may include a GC (Garbage Collection) operation, a WL (Wear Leveling) operation, and a map flush operation.

The re-ordering the commands depending on the types and the priorities may include: re-ordering, among the commands, first commands having the same index, and the performing of command operations corresponding to the re-ordered commands on the memory dies may include: simultaneously performing first command operations corresponding to the first commands.

The first command operations may be command operations for sequential data according to the types of the commands.

BRIEF DESCRIPTION OF THE DRAWINGS

The above and other features and advantages of the present to invention will become more apparent to those skilled in the art to which the present invention belongs by describing in detail various embodiments thereof with reference to the attached drawings in which.

DETAILED DESCRIPTION

Figure 1:
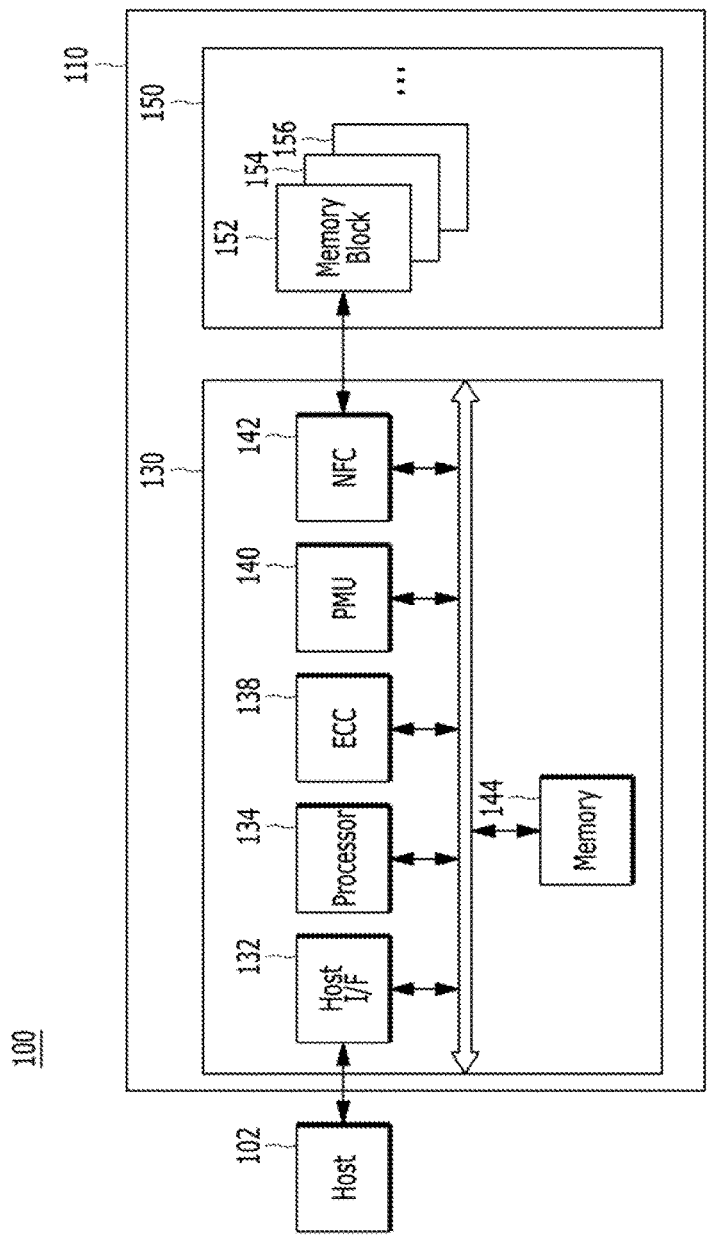
FIG. 1 is a diagram illustrating a data processing system including a memory system, according to an embodiment of the present invention.

Although, various embodiments are described below in more detail with reference to the accompanying drawings, we note that the present invention may, however, be embodied in different forms and should not be construed as being limited to an embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of embodiments of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising" "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 illustrates a data processing system including a memory system, according to an embodiment of the present invention.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102. For example, the memory system 110 may store data to be accessed by the host 102. The memory system 110 may be used as a main memory system or an auxiliary memory system of the host 102. The memory system 110 may be implemented with any one of various storage devices, according to the protocol of a host to interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device a compact flash (CF) card, a smart media (SM) card, a memory stick, and the like.

The storage devices for the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device configured as a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device configured as a memory card, such as, for example, a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDH, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP) a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply to the device is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

For example, the controller 130 may include a host interface unit 132, a processor 134, an error correction code (ECC) unit 138, a power management unit 140, a NAND flash controller 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with a volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102, The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
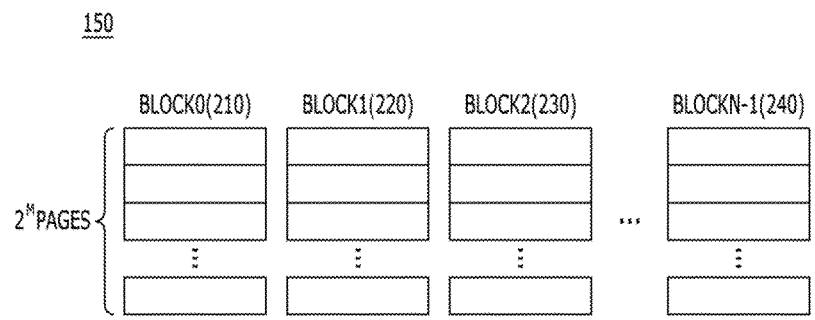
FIG. 2 is a diagram illustrating an example of a memory device employed in the memory system of FIG. 1.

FIG. 2 is a schematic diagram illustrating the memory device 150 of FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
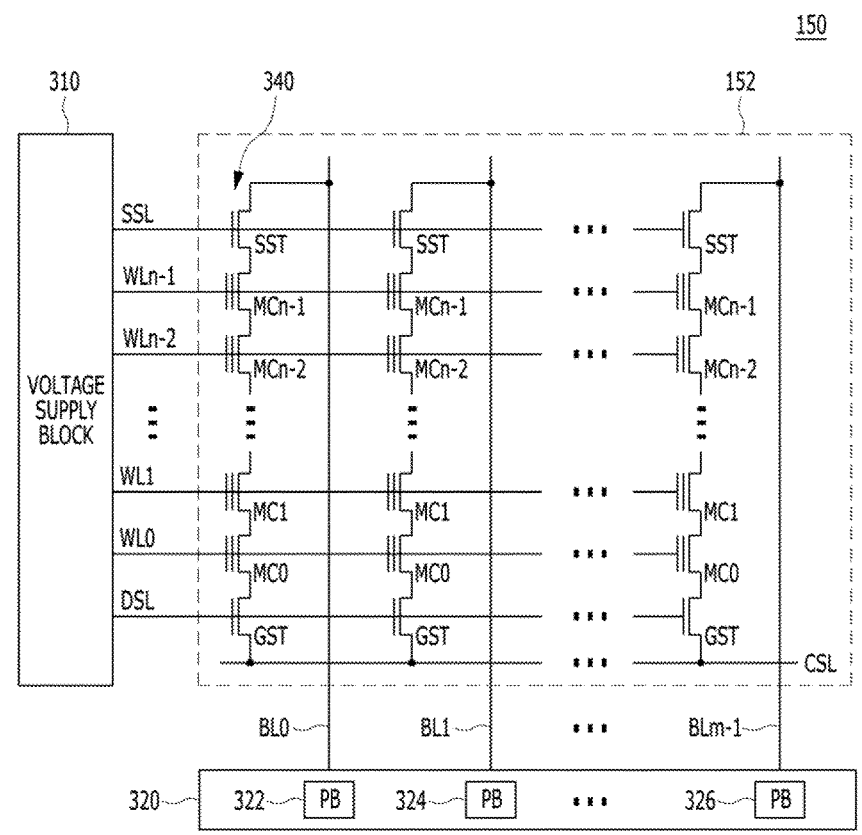
FIG. 3 is a circuit diagram illustrating a memory block in a memory device according to an embodiment of the present invention.

FIG. 3 is a circuit diagram illustrating one of the plurality of memory blocks 152 to 156 of FIG. 1.

Referring to FIG. 3, the memory block 152 of the memory device 150 may include a plurality of cell strings 340 which are electrically coupled to bit lines BL0 to BLm-1 respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with an embodiment is not limited to NAND flash memory and may be to realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CT) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating the memory device 150 of FIG. 1.

Figure 4:
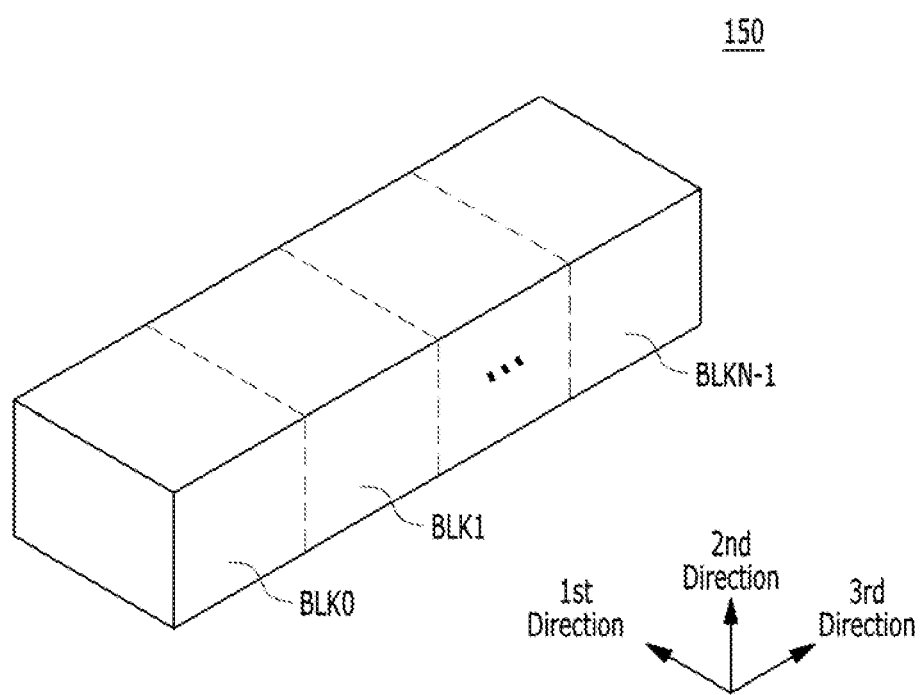
FIGS. 4 to 11 are diagrams schematically illustrating various aspects of the memory device of FIG. 2.

FIG. 4 is a block diagram illustrating an example of the plurality of memory blocks 152 to 156 of the memory device 150 of FIG. 1.

Referring to FIG. 4, the memory device 150 may include a plurality of memory blocks BLK0 to BLKN-1, and each of the memory blocks BLK0 to BLKN-1 may be realized in a three-dimensional (3D) structure or a vertical structure. The respective memory blocks BLK0 to BLKN-1 may include structures which extend in first to third directions, for example, an x-axis direction, a y-axis direction and a z-axis direction.

The respective memory blocks BLK0 to BLKN-1 may include a plurality of NAND strings NS extending in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. Namely, the respective memory blocks BLK0 to BLKN-1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
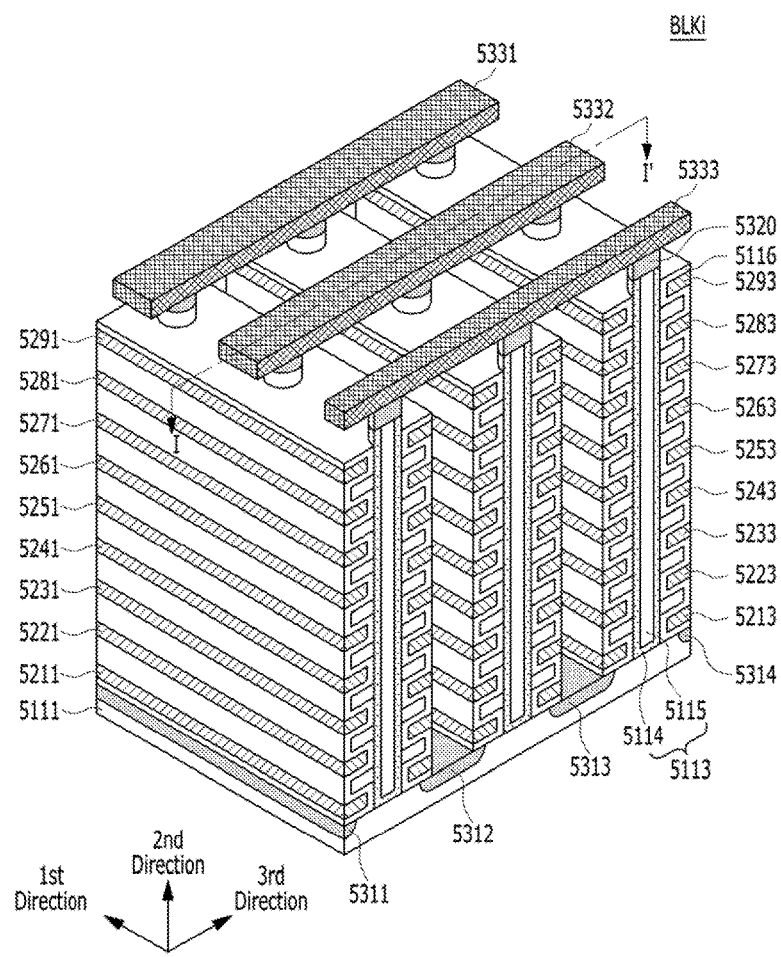
Figure 6:
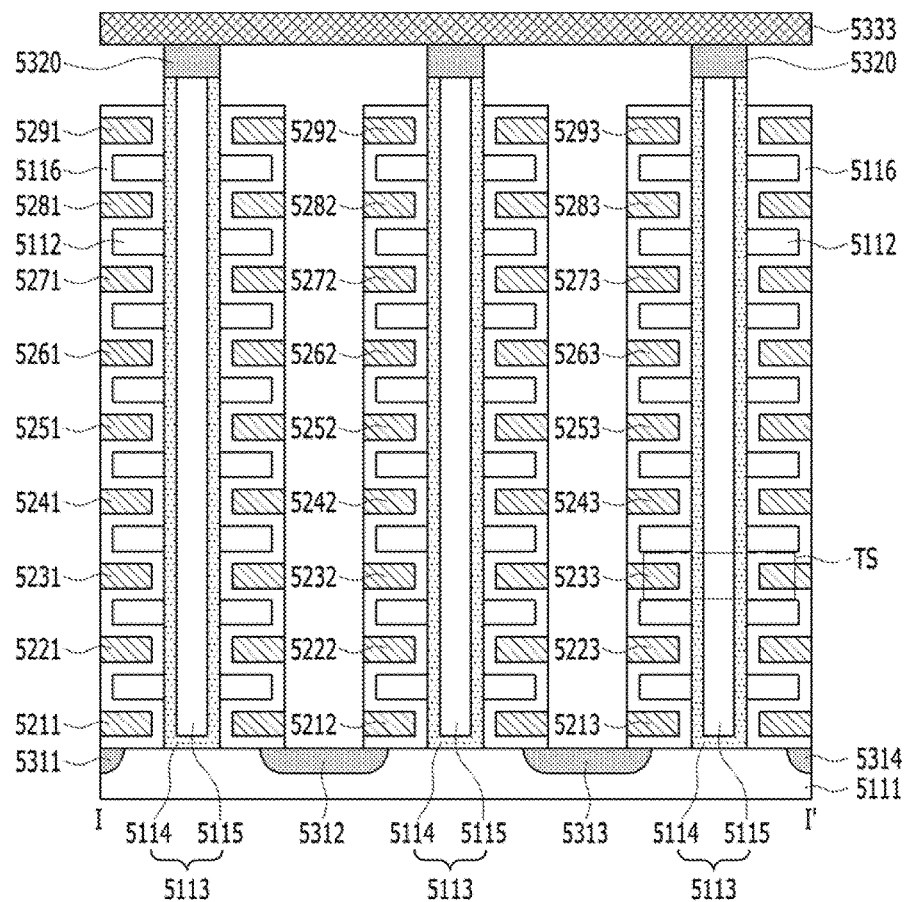

FIG. 5 is a perspective view of one BLKi of the plural memory blocks BLK0 to BLKN-1 of FIG. 4. FIG. 6 is a cross-sectional view taken along a line I-I' of the memory block BLKi of FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 extending in the first direction may be provided over the substrate 5111. The plurality of doping regions 5311 to 5314 may contain a second type of impurity that is different from the substrate 5111. The plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 extending in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of to materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. In other words, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 extending in the first direction may be provided between the dielectric materials 5112. The conductive material 5291 which extends in the first direction may be provided over the uppermost dielectric material 5112. The conductive materials 5211 to 5291 extending in the first direction may be a metallic material. The conductive materials 5211 to 5291 extending in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 extending in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 extending in the first direction may be provided.

Drains 5320 may be respectively provided over the plurality of pillars 5113. The drains 5320 may be silicon materials doped with second type impurities. The drains 5320 may be silicon materials to doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 extending in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 extending in the third direction may be electrically coupled with through contact plugs. The conductive materials 5331 to 5333 extending in the third direction may be a metallic material. The conductive materials 5331 to 5333 extending in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 extending in the first direction. The respective pillars 5113 may form NAND strings NS together with the dielectric layer 5116 and the conductive materials 5211 to 5291, 5212 to 5292 and 5213 to 5293 extending in the first direction. Each NAND string NS may include a plurality of transistor structures TS.

Figure 7:
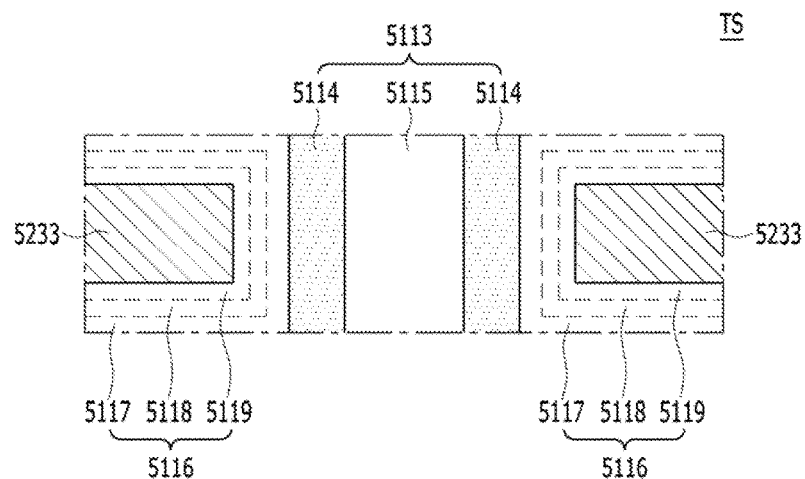

FIG. 7 is a cross-sectional view of the transistor structure TS of FIG. 6.

Referring to FIG. 7, in the transistor structure TS of FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In an embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS extending in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 extending in the first direction. In other words, the gates or the control gates may extend in the first direction and form word lines and at least two select lines, at least one source select line SSL and at least one ground select line GSL.

The conductive materials 5331 to 5333 extending in the third direction may be electrically coupled to one end of the NAND strings NS. The conductive materials 5331 to 5333 extending in the third direction may serve as bit lines BL. That is, in one memory block BLKi, the plurality of NAND strings NS may be electrically coupled to one bit line BL.

The second type doping regions 5311 to 5314 extending in the first direction may be provided to the other ends of the NAND strings NS. The second type doping regions 5311 to 5314 extending in the first direction may serve as common source lines CSL.

Namely, the memory block BLKi may include a plurality of NAND strings NS extending in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 extending in the first direction are provided in 9 layers, it is to be noted that the conductive materials 5211 to 5291, 5212 to 5292 and 5213 to 5293 extending in the first direction are not limited to being provided in 9 layers. For example, conductive materials extending in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that an embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 extending in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that an embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
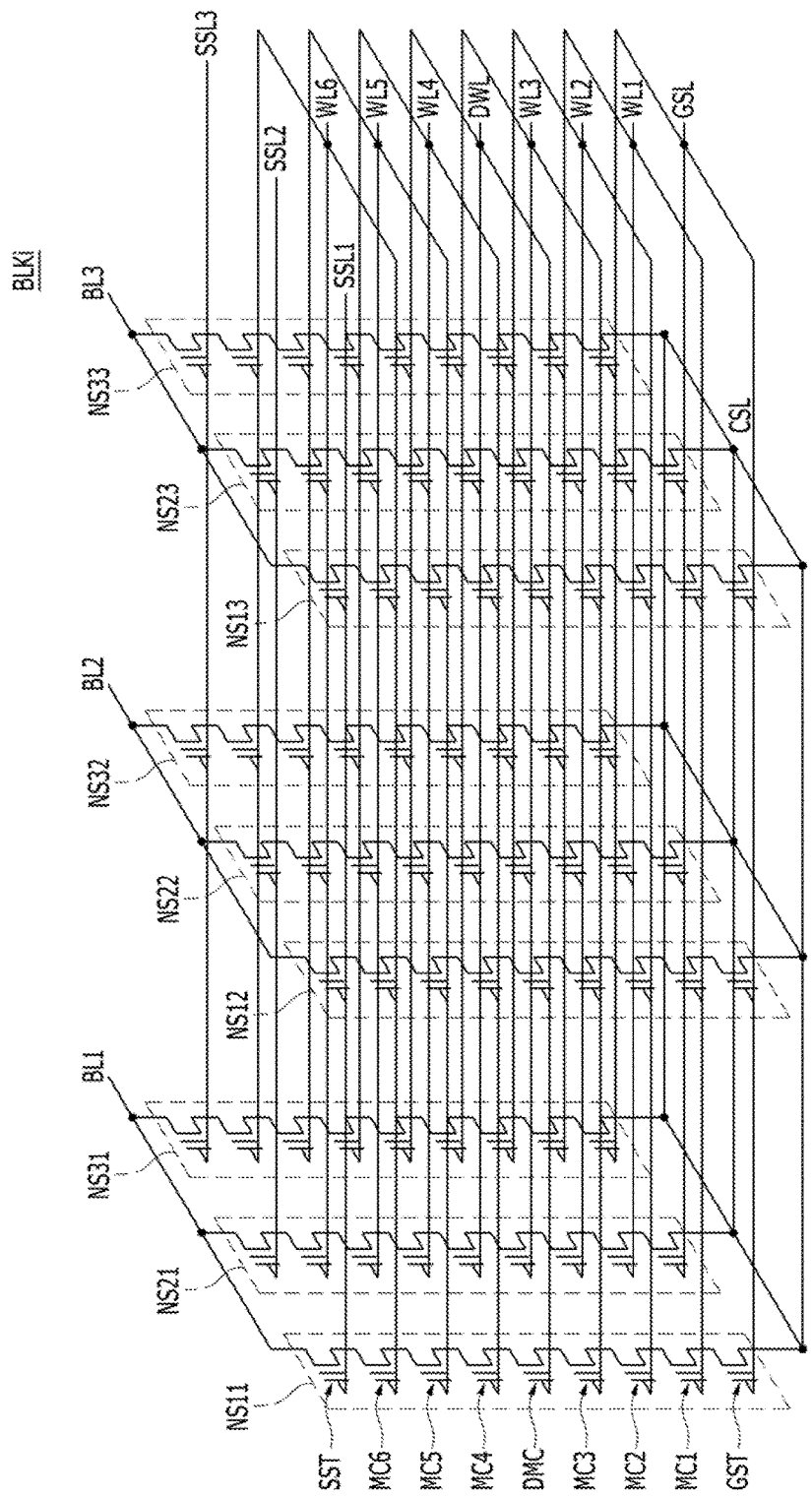

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC5 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line L. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 extending in the first direction may be provided. The conductive materials 5211 to 5291, 5212 to 5292 and 5213 to 5293 extending in the first direction may be electrically coupled in common to upper layers through contacts. At the upper layers, the conductive materials 5211 to 5291, 5212 to 5292 and 5213 to 5293 extending in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer the first to fourth doping regions 5311 to 5314 may be electrically coupled.

Namely, as of FIG. 8 the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show the memory device in the memory system in accordance with an embodiment implemented with a three-dimensional (3D) nonvolatile memory device different from the first structure.

Figure 9:
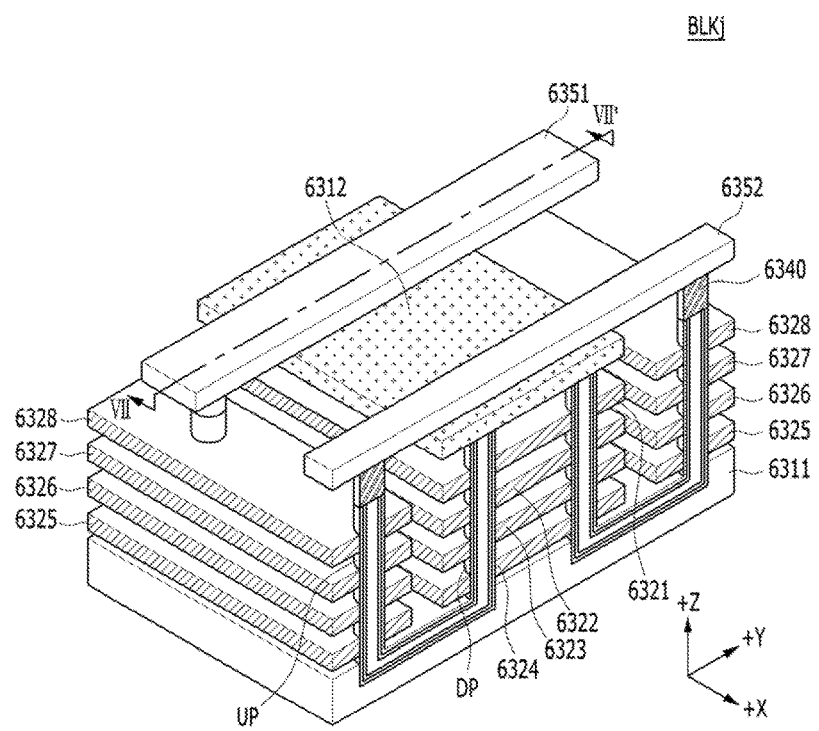

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
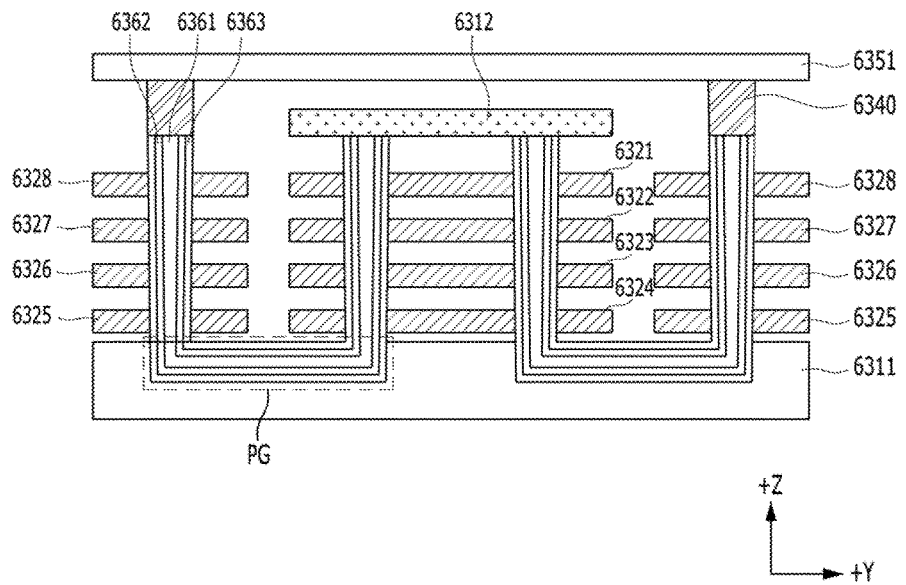

Referring to FIGS. 9 and 10, the memory block BLKj among the plurality of memory blocks of the memory device 150 of FIG. 1 may include structures extending in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in an embodiment for the sake of convenience that the substrate 6311 is p-type silicon, it is to be noted that the substrate 6311 is not limited to being p-type silicon.

First to fourth conductive materials 6321 to 6324 extending in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 extending in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 extending in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line L.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
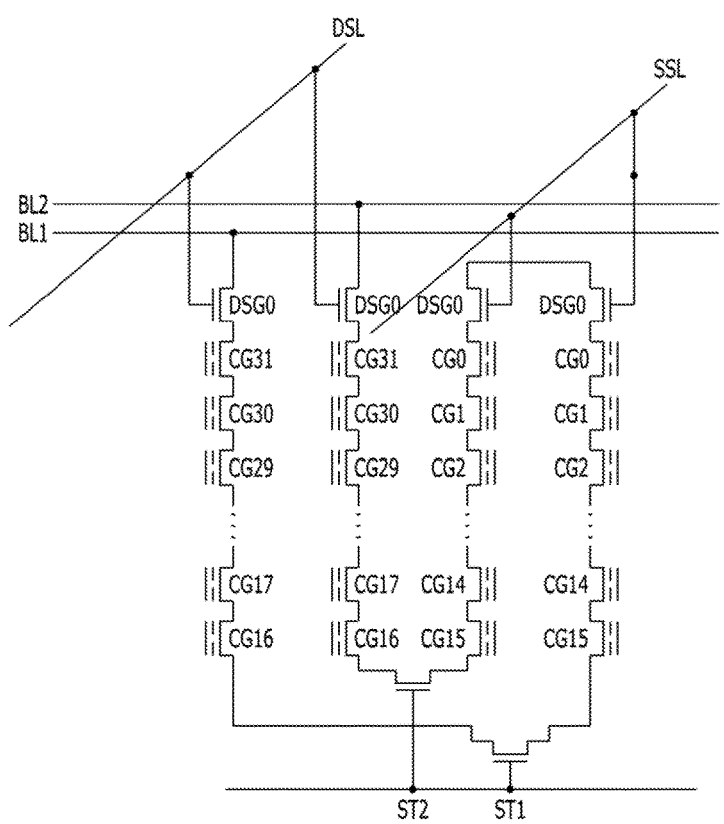

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

Namely, in the certain memory block BLKj having the second structure, memory cells CG0 to CG31 stacked along a first channel CH1 (not shown) for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the to first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Hereinafter, a data processing operation to a memory device in a memory system in accordance with an embodiment of the present invention, particularly, an operation corresponding to a command received from a host 102 will be described in detail with reference to FIGS. 12 and 13.

Figure 12:
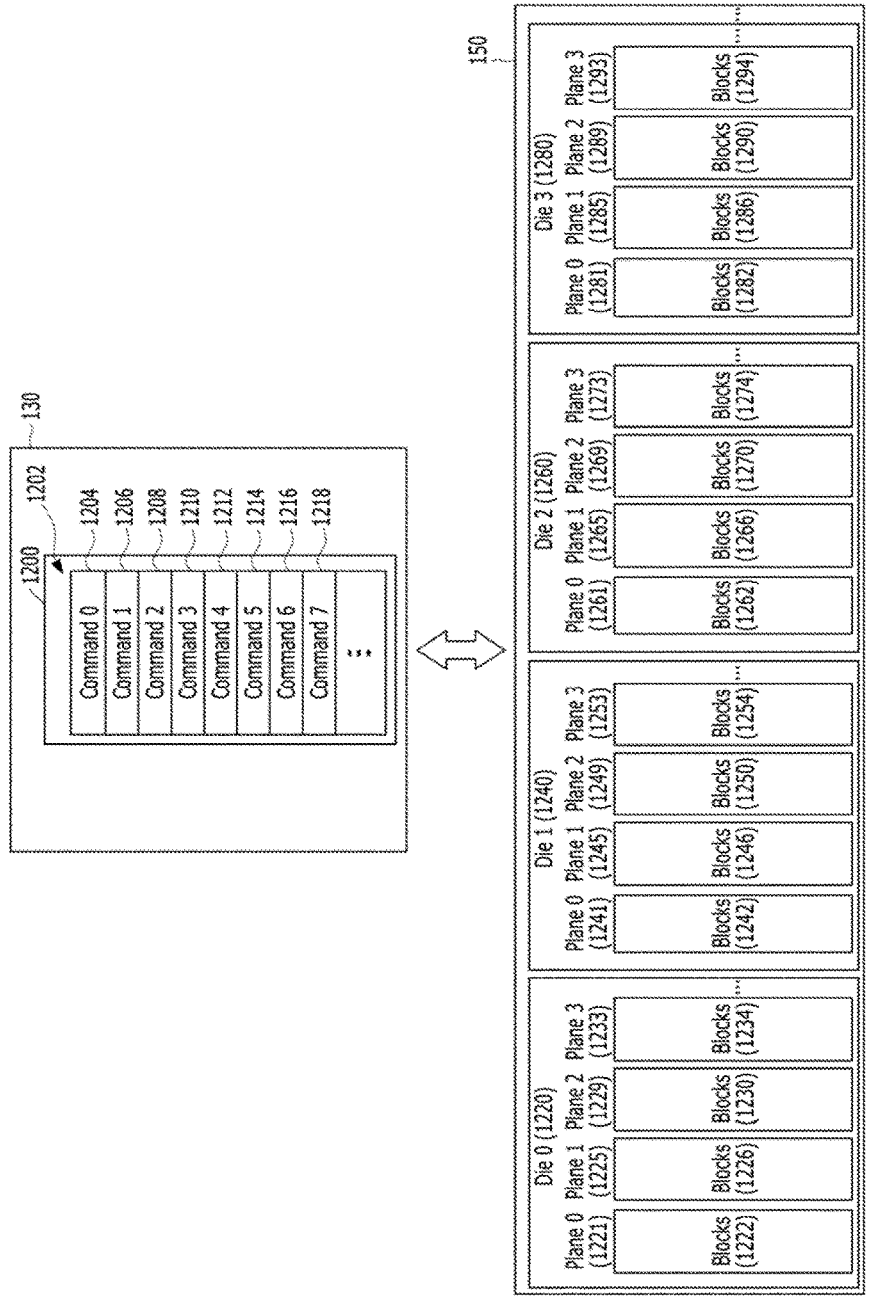
FIG. 12 is a diagram for describing a data processing operation to a memory device in a memory system, according to an embodiment of the present invention.

FIG. 12 is a diagram for describing a data processing operation to a memory device in a memory system, according to an embodiment of the present invention.

In an embodiment, for the sake of convenience in explanation, a description will be provided for an example in which the memory system 110 shown in FIG. 1 stores read data or write data corresponding to a command, e.g., a read command or a write command, received from the host 102, in a buffer/cache included in the memory 144 of the controller 130, and reads/writes the data stored in the buffer/cache on a plurality of memory blocks included in the memory device 150. Accordingly, the memory system 110 may perform an operation corresponding to the command received from the host 102. (Hereinafter, "an operation corresponding to a command received from the host" is referred to as a "command operation.") For example, the memory system 110 may perform a data read operation and a data program operation corresponding to a read command and a write command.

Furthermore, in an embodiment, for the sake of convenience in explanation, a data processing operation in the memory system 110 will be described as being performed by the controller 130. In particular, the processor 134 included in the controller 130 may perform a data processing operation, for example, through an TFL. The controller 130 may store user data and meta data corresponding to a write command received from the host 102, in the buffer included in the memory 144 of the controller 30 and then may program the data stored in the buffer, on an arbitrary memory block among the plurality of memory blocks included in the memory device 150, in other words, perform a program operation. Further, the controller 130 may read user data and meta data corresponding to a read command received from the host 102, from a plurality of pages included in a corresponding memory block of the memory device 150, may store the user data and meta data in the buffer included in the memory 144 of the controller 130, and then may provide the data stored in the buffer to the host 102, in other words, perform a read operation.

For the program operation, the meta data may include first map data including logical to physical (L2P) information (hereinafter, referred to as 'logical information') on data stored in the memory blocks, and second map data including physical to logical (P2L) information (hereinafter, referred to as 'physical information'). Furthermore, the meta data may include information on data corresponding to a command received form the host 102, information on a command operation, information on memory blocks of the memory device 150 on which the command operation is performed, and information on map data corresponding to the command operation. In other words, the meta data may include all information and data except for user data corresponding to the command received from the host 102.

In an embodiment, the memory device 150 may include a plurality of memory dies. Each of the memory dies may include a plurality of planes, and each of the planes may include a plurality of memory blocks. The memory device 150 may program and store user data and meta data for a command operation corresponding to a command received from the host 102, in the memory blocks, and may read the user data and meta data stored in the memory blocks, and may provide the user data and meta data to the host 102.

In this regard, in an embodiment, the controller 130 may check command operations corresponding to commands received from the host 102, and command operations corresponding to internal commands of the memory system 110, may re-order the commands received from the host 102 and the internal commands from the memory system 110, and may perform command operations corresponding to the re-ordered respective commands, thereby maximizing the operation performance for the command operations in the memory system 110. For example, the controller 130 may check a plurality of commands received from the host 102, e.g., a plurality of read commands, a plurality of write commands, a background operation command, and internal commands of the memory system 110, e.g., an index or identification of an internal background operation command. In particular, the controller 130 may check types and priorities of the commands (received commands from the host and internal commands), may re-order the respective commands according to their types and priories, and may perform command operations corresponding to the re-ordered commands.

In an embodiment, the controller 130 may check priorities between read operations corresponding to read commands, write operations corresponding to write commands, and background operations corresponding to background operation commands. That is, the controller 130 may check the priorities between read data corresponding to the read operations, write data corresponding to the write operations, background data corresponding to the background operations, and may re-order corresponding commands based on their respective priorities. For example, the controller 130 may determine the priorities depending on at least one of the following: a data value in data employed in command operations corresponding to the respective commands, reliabilities of the command operations for the data, a processing reliability of data, a size of the data, and so forth, and then re-order corresponding commands according to the respective priorities. That is, the priorities of the commands may be determined depending on a data value in data employed in command operations corresponding to the respective commands, the reliabilities of the command operations for the data, the reliability of data processing, the size of the data, and so forth.

Furthermore, in an embodiment, the controller 130 may check the types of read operations corresponding to read commands, write operations corresponding to write commands, and background operations corresponding to background operation commands. The controller 130 may check the types for read data corresponding to the read operations, write data corresponding to the write operations, background data corresponding to the background operations, and may re-order corresponding commands. In this regard, the controller 130 may check the types determined depending on characteristics of data in command operations corresponding to the respective commands, a locality of the data, a processing pattern of data, and a frequency, the number of times or aging of the command operations for data, and then re-order corresponding commands according to the respective types of the commands. That is, the types of the commands may be determined depending on the characteristics of data in command operations corresponding to the respective commands, the locality of the data, the processing pattern of data, the frequency, the number of times, or aging of the command operations for data, and so forth.

In an embodiment, with regard to the command operations corresponding to the commands received from the host 102, a read operation and a write operation for random/sequential/hot/cold data depending on the type of data may be performed, and a background operation for the memory device 150 may be performed for the read operation and the write operation. In this regard, with regard to the background operation corresponding to the background operation command, for example, the memory system 110 may perform an operation of changing and updating meta data including map data without performing a read/write operation for user data, in other words, without changing the user data stored in the memory device 150, may perform a processing operation, for example, a GC (Garbage Collection) operation, of copying data stored in the memory blocks of the memory device 150 to an arbitrary memory block, may perform a processing operation, for example, a WL (Wear Leveling) operation of swapping memory blocks of the memory device 150 or data stored in the memory blocks with each other, or may perform an operation, for example, a map flush operation, of storing map data or meta data stored in the controller 130, in the memory blocks of the memory device 150.

In an embodiment, based on priority information included, in the form of context or flag, in the commands received in the host 102, to the controller 130 may check the priorities of commands, or may check command operations corresponding to the respective commands, a data processing pattern such as a read/program/write pattern for data, or a data type such as random/sequential/locality/hot/cold, and may re-order the commands received from the host 102. Hereinafter, the data processing operation in the memory system according to an embodiment will be described in more detail with reference to FIG. 12.

Referring to FIG. 12, when the controller 130 receives commands 1202 from the host 102, the controller 130 may store the commands 1202 in a queuing unit 1200, may re-order the commands 1202 depending on priorities and types of the commands 1202, and may perform command operations corresponding to the re-ordered commands 1202 on the memory device 150. The queuing unit 1200 may be included in the memory 144.

The memory device 150 may include a plurality of memory dies, for example, first to fourth memory dies 1220, 1240, 1260 and 1280. Each of the first to fourth memory dies 1220, 1240, 1260 and 1280 may include a plurality of planes. For example, the first memory die 1220 includes four planes 1221, 1225, 1229 and 1233, the second memory die 1240 includes four planes 1241, 1245, 1249 and 1253, the third memory die 1260 includes four planes 1261, 1265, 1269 and 1273, and the fourth memory die 1248 includes four planes 1281, 1285, 1289 and 1293.

Each of the planes 1221, 1225, 1229, 1233, 1241, 1245, 1249, 1253, 1261, 1265, 1269, 1273, 1281, 1285, 1289 and 1293 may include a plurality of memory blocks 1222, 1226, 1230, 1234, 1242, 1246, 1250, 1254, 1262, 1266, 1270, 1274, 1282, 1286, 1290 and 1294, respectively. For example, as shown in FIG. 2, each plane may include an N number of memory blocks Block0, Block1, . . . , BlockN-1 each including a $2^M$ number of pages ($2^M$ Pages).

For example, in more detail, when the controller 130 successively receives, from the host 102, a plurality of commands 1202, for example, in a sequence of first to eighth commands 204, 1206, 1208, 1210, 1212, 1214, 1216 and 1218, the controller 130 may store all the commands 1202 including the first command 1204 to the eighth command 1218 in the queuing unit 1200.

Furthermore, the controller 130 may check an index or identification of the commands 1202 for re-ordering the commands 1202. The controller may, for example, check priority information included in the commands 1202 in the form of context or flag, or may check command operations corresponding to the commands 1202 and the priorities and types of data corresponding to the command operations, and may re-order the commands 1202 stored in the queuing unit 1200. In an embodiment, the controller may check an index or identification of the commands 1202 and, based on the index or identification, the controller may check priority information included in the commands 1202 in the form of context or flag, or check command operations corresponding to the commands 1202 and the priorities and types of data corresponding to the command operations, and may re-order the commands 1202 stored in the queuing unit 1200.

In this regard, for the sake of convenience in explanation, detailed description will be provided for an example in which the first command 1204, the second command 1206, the seventh command 1216 and the eighth command 1218 are commands requesting read operations for the same sequential read data from the first to fourth memory dies 1220, 1240, 1260 and 1280 of the memory device 150, the sixth command 1214 is a command requesting a read operation for random read data from the first to fourth memory dies 1220, 1240, 1260 and 1280 of the memory device 150, the third command 1208 and the fourth command 1210 are commands requesting write operations for write data in the first to fourth memory dies 1220, 1240, 1260 and 1280 of the memory device 150, and the fifth command 1212 is a command requesting a background operation for the first to fourth memory dies 1220, 1240, 1260 and 1280 of the memory device 150.

In addition, priority information may be included in each of the first to eighth commands 1204, 1206, 1208, 1210, 1212, 1214, 1216 and 1218 in the form of context or flag. For example, in the third command 1208 received from the host 102 at a time t2, priority information indicating that the third command 1208 has a priority to higher than that of the second command 1206 received from the host 102 at a time t1 preceding the time t2 is included in the form of context or flag. In the fourth command 1210 received from the host 102 at a time t3, priority information indicating that the fourth command 1210 has a priority higher than that of the third command 1208 received from the host 102 at the time t2 preceding the time t3 is included in the form of context or flag. Furthermore, in the fifth command 1212 received from the host at a time t4, priority information indicating that the fifth command 1212 has a priority higher than that of the fourth command 1210 received from the host 102 at the time t3 preceding the time t4 is included n the form of context or flag. Further, in the sixth command 1214 received from the host at a time t5, priority information indicating that the sixth command 1214 has a priority higher than that of the fifth command 1212 received from the host 102 at the time t4 preceding the time t5 is included in the form of context or flag.

As such, the controller 130 may check the priorities and types of the first to eighth commands 1204, 1206, 1208, 1210, 1212, 1214, 1216 and 1218 stored in the queuing unit 1200 of the memory 144, re-order the first to eighth commands 1204, 1206, 1208, 1210, 1212, 1214, 1216 and 1218, and then perform command operations corresponding to the respective re-ordered commands 1204, 1206, 1208, 1210, 1212, 1214, 1216 and 1218 on the first to fourth memory dies 1220, 1240, 1260 and 1280 of the memory device 150.

In this regard, the controller 130 may re-order the first to eighth commands 1204, 1206, 1208, 1210, 1212, 1214, 1216 and 1218 so that the first command 1204, the second command 1206, the seventh command 1216 and the eighth command 1218 requesting the read operations for the same sequential read data are simultaneously processed, according to the priorities and types of the respective first to eighth commands 1204, 1206, 1208, 1210, 1212, 1214, 1216 and 1218. Furthermore, the controller 130 may order the first to eighth commands 1204, 1206, 1208, 1210, 1212, 1214, 1216 and 1218 so that the sixth command 1214 having the highest priority is first processed, and then successively order the first to eighth commands 1204, 1206, 1208, 1210, 1212, 1214, 1216 and 1218 according to the priorities thereof. That is, the controller 130 may re-order the first to eighth commands 1204, 1206, 1208, 1210, 1212, 1214, 1216 and 1218 to be processed in a sequence starting with the sixth command 1214, followed by the fifth command 1212, the fourth command 1210, the third command 1208, the first command 1204, the second command 1206, the seventh command 1216 and the eighth command 1218 according to the priorities and types of the first to eighth commands 1204, 1206, 1208, 1210, 1212, 1214, 1216 and 1218.

The controller 130 may perform command operations corresponding to the re-ordered respective commands 1204, 1206, 1208, 1210, 1212, 1214, 1216 and 1218 in the first to fourth memory dies 1220, 1240, 1260 and 1280 of the memory device 150. In other words, the controller 130 may sequentially perform starting with a read operation corresponding to the sixth command 1214, followed by a background operation corresponding to the fifth command 1212, followed by a write operation corresponding to the fourth command 1210, followed by a write operation corresponding to the third command 1208, followed by simultaneously performed read operations corresponding to the first command 1204, the second command 1206, the seventh command 1216 and the eighth command 1218.

As another example, if the first command 1204, which is first received from the host 102 at a time t0, has the highest priority, the controller 130 may re-order depending on their priorities and types, the first to eighth commands 1204, 1206, 1208, 1210, 1212, 1214, 1216 and 1218 so that the first command 1204, the second command 1206, the seventh command 1216 and the eighth command 1218 requesting the read operations for the same sequential read data are simultaneously processed first, that is, so that the commands 1204, 1206, 1216 and 1218 having the same index are simultaneously processed first.

As such, in an embodiment, after the priorities and types of the commands 1202 have been checked based on the index and identification of the plurality of commands 1202 received from the host 102, the commands 1202 are re-ordered according to their to priorities and types, and then the command operations corresponding to the re-ordered commands 1202 are performed. Therefore, the command operations for the commands 1202 received from the host 102 can be more efficiently performed, a data processing operation on the memory device 150 can be more rapidly and stably performed, and thus, the performance of the memory system 110 can be enhanced.

Hereinafter, the data processing operation in the memory system, in accordance with an embodiment will be described in detail with reference to FIG. 13.

Figure 13:
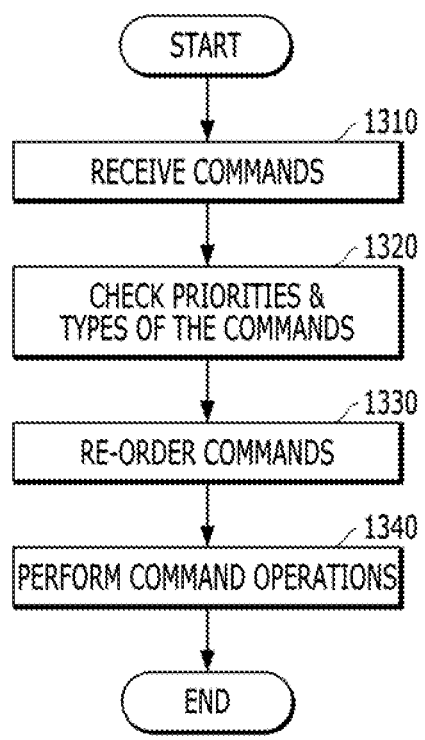
FIG. 13 is a flow chart illustrating a data processing operation in a memory system, according to an embodiment of the present invention.

FIG. 13 is a flow chart illustrating a data processing operation in the memory system, according to an embodiment of the present invention.

Referring to FIG. 13, the memory system receives, at step 1310, a plurality of commands e.g. commands received from a host (host 102 of FIG. 1) and/or internal commands and, at step 1320, checks priorities and types of the commands based on an index or identification of the commands received from the host 102 and or internal commands, in other words, checks the priorities and types of data corresponding to command operations for the commands.

At step 1330, the memory system re-orders the commands received from the host 102 according to the priorities and types of the commands and, at step 1340, performs the command operations corresponding to the re-ordered commands on the memory device 150 according to the new order.

In this regard, descriptions have been provided, with reference to FIG. 12, for the operation of checking the plurality of commands received from the host, and the operation of re-ordering the commands according to the priorities and types of the commands and performing the command operations corresponding to the re-ordered commands. Therefore, the detailed description related to these will be omitted.

As described above, the memory system and the operating method thereof in accordance with embodiments may minimize the complexity and performance deterioration of the memory system, thereby more rapidly and reliably processing data to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device comprising a plurality of memory cells in which data is stored; and
   a controller suitable for checking types and/or priorities of a plurality of commands entered from a host, and a plurality of internal commands generated in the memory system, based on index or identification of the commands and the internal commands, re-ordering the commands and the internal commands depending on the types and/or the priorities, and performing command operations corresponding to the re-ordered commands.

2. The memory system of claim 1, wherein the priorities indicate priorities of the command operations or priorities of data corresponding to the command operations, and are included in the commands in the form of a context or a flag.

3. The memory system of claim 2, wherein the priorities indicate priorities between a first command operation or first data corresponding to a first command received from the host at a first time, and a second command operation or second data corresponding to the second command received from the host at a second time.

4. The memory system of claim 1, wherein the priorities are determined depending on at least one of a value of data corresponding to the command operations, reliabilities of the command operations for the data, a processing reliability of the data, and a size of the data.

5. The memory system of claim 1, wherein the types are determined depending on at least one of characteristics of data corresponding to the command operations, a locality of the data, a processing pattern of the data, and a frequency, the number of times or aging of the command operations for the data.

6. The memory system of claim 1, wherein the memory device comprises a plurality of memory dies, each memory die including a plurality of memory planes, each plane including a plurality of memory blocks, said plurality of memory cells being distributed among the plurality of memory blocks, and wherein the command operations include a read operation or write operation for random/sequential/hot/cold data, and a background operation for the memory device.

7. The memory system of claim 6, wherein the controller successively performs the command operations from a command operation having a highest priority according to the priorities, and simultaneously performs command operations for data of the same type according to the types.

8. The memory system of claim 6, wherein the background operation includes a GC (Garbage Collection) operation, a WL (Wear Leveling) operation, and a map flush operation.

9. The memory system of claim 1, wherein the controller simultaneously performs first command operations corresponding to first commands.

10. The memory system of claim 9, wherein the first command operations are command operations for sequential data according to the types of the commands.

11. An operating method of a memory system, the operating method comprising:
receiving a plurality of commands entered from a host for a plurality of pages, which are included in each of a plurality of memory blocks of a memory device, and which include a plurality of memory cells;
generating a plurality of internal commands for a background operation;
checking types and/or priorities of the commands and the internal commands based on index or identification of the commands;
re-ordering the commands and the internal commands depending on the types and the priorities; and
performing command operations corresponding to the re-ordered commands on the memory dies.

12. The operating method of claim 11, wherein the priorities indicate priorities of the command operations or priorities of data corresponding to the command operations, and are included in the commands in the form of context or flag.

13. The operating method of claim 12, wherein the priorities indicate priorities between a first command operation or first data corresponding to a first command received from the host at a first time, and a second command operation or second data corresponding to the second command received from the host at a second time.

14. The operating method of claim 11, wherein the priorities are determined depending on at least one of a value of data corresponding to the command operations, reliabilities of the command operations for the data, a processing reliability of the data, and a size of the data.

15. The operating method of claim 11, wherein the types are determined depending on at least one of characteristics of data corresponding to the command operations, a locality of the data, a processing pattern of the data, and a frequency, the number of times or aging of the command operations for the data.

16. The operating method of claim 11, wherein the command operations include a read operation or write operation for random/sequential/hot/cold data, and the background operation for the memory device.

17. The operating method of claim 16, wherein the performing of command operations corresponding to the re-ordered commands on the memory dies comprises:
successively performing the command operations from a command operation having a highest priority according to the priorities, and
simultaneously performing command operations for data of the same type according to the types.

18. The operating method of claim 16, wherein the background operation includes a GC (Garbage Collection) operation, a WL (Wear Leveling) operation, and a map flush operation.

19. The operating method of claim 11, wherein the re-ordering the commands depending on the types and the priorities comprises: re-ordering, among the commands, first commands having the same index, and
wherein the performing of command operations corresponding to the re-ordered commands on the memory dies comprises: simultaneously performing first command operations corresponding to the first commands.

20. The operating method of claim 19, wherein the first command operations are command operations for sequential data according to the types of the commands.

* * * * *